United States Patent [19]
Bateman et al.

[11] Patent Number: 5,719,527
[45] Date of Patent: Feb. 17, 1998

[54] METHOD AND APPARATUS FOR AMPLIFYING, MODULATING AND DEMODULATING

[75] Inventors: Andrew Bateman, Limpley Stoke; Kam Yuen Chan, Clifton, both of England

[73] Assignee: British Technology Group Limited, London, England

[21] Appl. No.: 335,841

[22] PCT Filed: May 10, 1993

[86] PCT No.: PCT/GB93/00954

§ 371 Date: Nov. 22, 1994

§ 102(e) Date: Nov. 22, 1994

[87] PCT Pub. No.: WO93/23921

PCT Pub. Date: Nov. 25, 1993

[30] Foreign Application Priority Data

May 8, 1992 [GB] United Kingdom ............ 9209982

[51] Int. Cl.⁶ .............. H03C 1/06; H03D 3/24; H03F 1/32; H03L 7/07
[52] U.S. Cl. .............. 330/10; 329/325; 329/346; 329/360; 330/103; 331/2; 331/23; 332/127; 332/162
[58] Field of Search .............. 331/2, 23; 332/127, 332/128, 144, 162; 329/325, 326, 346, 360; 330/10, 103

[56] References Cited

U.S. PATENT DOCUMENTS

| 3,748,590 | 7/1973 | Gray ............ 329/325 |
| 3,953,805 | 4/1976 | Couvillon ............ 328/162 |
| 4,420,723 | 12/1983 | de Jager ............ 331/2 |
| 5,105,168 | 4/1992 | DaSilva ............ 331/2 |

FOREIGN PATENT DOCUMENTS

| 0 293 828 | 12/1988 | European Pat. Off. |
| 2 073 516 | 10/1981 | United Kingdom |

*Primary Examiner*—Siegfried H. Grimm
*Attorney, Agent, or Firm*—Nixon & Vanderhye P.C.

[57] ABSTRACT

A highly efficient linear amplifier and/or modulator and demodulator comprising first and second feedback loops is provided. Each loop processes a component of the input signal and the component signals are recombined at, for example, a summing junction 18. The feedback signals for each loop are dependent upon the output signal and are in phase quadrature. The input signal is separated into I and Q signals, which are also in phase quadrature, by a component separator 10.

32 Claims, 5 Drawing Sheets

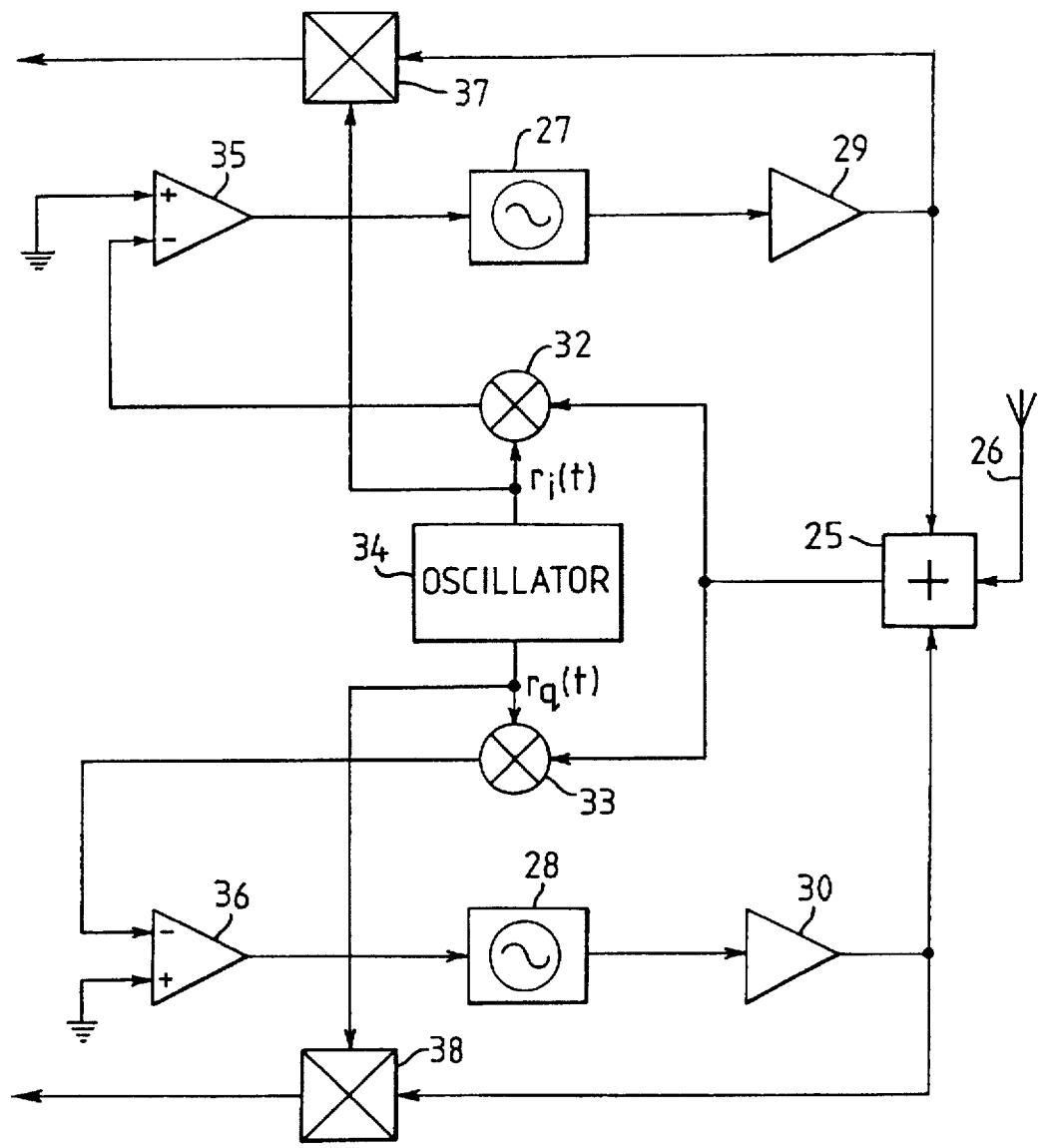
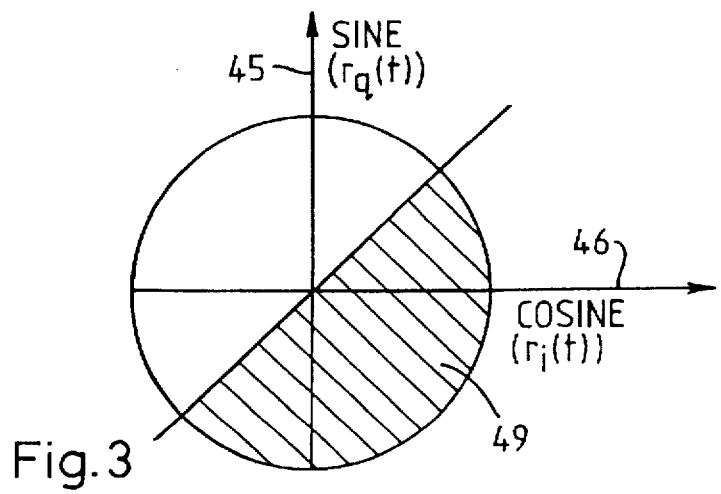
Fig. 2
Fig. 3

METHOD AND APPARATUS FOR AMPLIFYING, MODULATING AND DEMODULATING

The present invention relates to method and circuits for processing components of an input signal to provide a highly efficient linear amplifier and/or modulator or a demodulator.

BACKGROUND OF THE INVENTION

A LINC amplifier has been proposed (see D. C. Cox, "Linear Amplification Using Non-Linear Components", IEEE Transactions on Communications, Vol. COM-22, 1974, pages 1942 to 1945) in which a modulating signal is split into two phase modulated components with constant envelopes which can be amplified separately using highly non-linear but power efficient amplifiers. Combining the two output signals yields the desired linearly amplified signal. With a LINC amplifier the potential for dc to RF conversion efficiency can approach 100%, assuming ideal matching amplifiers. However, in practical LINC amplifiers, the suppression of broadband phase modulation relies on a very tight tolerance on the gain and phase match between the two paths. A gain error of 0.01 dB and a phase error of 0.1° give a component suppression of only 54 dB. Such a tolerance is impossible to achieve in a open loop system where much greater gain and phase variations can occur with changes in operating frequency, output power and temperature, and the ageing of components.

It is an object of this invention to provide a linear amplifier/modulator which does not suffer significantly from these problems.

From GB 2073516 an arrangement for amplifying a previously modulated carrier signal using two phase locked loops is already known and in which phase feedback and phase comparators are used. In one embodiment the feedback signals are taken from a point before the final summing circuit. In practice the summing circuit will be imperfect and any phase errors introduced by the summing circuit will degrade the performance of the system. The input signal is at or near the same frequency as the output signal and where the output is to be at radio frequencies (RF) implementation of the summing circuits 14 and 15 is, in practice, complicated. Such an arrangement could not receive a baseband signal and incorporate modulation of that signal within the phase locked loops.

In a second embodiment of GB 2073516, the feedback signal is taken from a point after the final summing circuit. However comparisons with the input signal are made in terms of the amplitude and phase and, when the input is at RF, such a system requires accurate RF envelope detection and subtraction and a wide dynamic range RF phase detector. Such devices are difficult to construct.

From U.S. Pat. No. 5,105,168 an arrangement for a vector locked loop for modulation of an input signal is already known. U.S. Pat. No. 5,105,168 incorporates a mixer in the feedback path so that comparisons may be made at or near the input signal frequency, which may be a baseband signal with an output signal at RF. However the realisation of envelope detectors for such an arrangement presents problems as they require subsequent filtering of the carrier components, which introduces an unacceptable amount of time delay. Additional significant time delays are introduced by the phase detector which is required to generate the difference component and the filter which is required to remove the sum component.

SUMMARY OF THE INVENTION

It is another object of the invention to provide an amplifier/modulator which may use the Cartesian components of an input signal. The advantage of the a Cartesian signal is that a representation of the signal can be produced with a low sampling rate, especially when derived by a digital signal processor (DSP).

It is a further object of the invention to provide an amplifier/modulator which incorporates modulation, amplification and summation within a feedback loop, so that there is compensation for any deficiencies in the system.

According to one aspect of the invention there is provided apparatus for processing components of an input signal to provide a processed output signal, comprising first and second feedback control loops for generating, in response to the input signal, respective components of a processed output signal, or for use in generating the processed output signal, and for ensuring that the components are in a correct phase relationship with each other for this purpose, each loop comprising means for generating a loop output signal having a frequency or phase which is variable in response to a control signal, and which forms one of the components of the processed output signal, or from which one such component is derived, and a comparator for generating the control signal, and means for combining the loop output signals in deriving a resultant signal, and means for providing first and second feedback signals, dependent on the resultant signal and in phase quadrature with one another, the feedback signals being applied to one input of the comparators of the first and second loops, respectively, and another input of each comparator being coupled to receive a reference signal indicative of a desired value of the control signal.

According to a second aspect of the invention there is provided a method of processing the components of an input signal to provide a processed output signal by using first and second feedback control loops to generate, in response to the input signal, respective components of the processed output signal, or for use in generating the processed output signal, and for ensuring that the components are in a correct phase relationship with each other for this purpose, comprising generating a loop output signal for each loop having a frequency which is variable in response to a respective control signal and which forms one of the components of the processed output signal, or from which one such component is derived, combining the loop output signals in deriving a resultant signal, generating feedback signals from the resultant signal in phase quadrature with one another, one for each loop, and comparing each feedback signal with a respective reference signal to provide the respective control signals.

Processing carried out by the invention may, for example, be modulation and/or amplification, or demodulation.

The feedback signals may be provided by mixing the said resultant signal with respective quadrature signals from an oscillator.

Where modulation is to be carried out, the Cartesian components of the input signals may be applied as the reference signals and the said resultant signal is the modulated output signal in which a signal at the frequency of the oscillator is modulated by the input signal, that is frequency translation of the input signal to the frequency of the oscillator occurs.

For amplification, each loop contains an amplifier to amplify the loop output signals before they are combined, and if any amplification without modulation is required, then the oscillator output frequency is set to zero.

To achieve demodulation the loop output signals are combined with a modulated signal in such a way that frequency translated signals derived from the resultant signal indicate any frequency or phase deviations of the loop output signals from respective components of the modulated signal. Also a zero magnitude signal is applied as the respective reference signals, for example by grounding one input terminal of each comparator, and the loop output signals are demodulated using the respective quadrature components of the oscillator output signals to provide components of the output signal which can then be combined in a known way to derive a signal representative of the modulation of the modulated signal.

One of the main advantages of the circuit is that it allows components of an output signal, or a signal from which such components can be derived, to be generated and combined within a control loop so that problems of errors in combination are significantly reduced.

Other advantages which may be achieved include maximising the efficiency of the modulator/amplifier particularly when used in a transmitter, the ability to construct circuits according to the invention with readily available, low cost, low tolerance components, and minimising or eliminating the use of complex digital signal processing.

The demodulator also allows a variable strength input signal, such as might be received by a radio system, to be converted to two phase modulated components of constant amplitude which are easier to process.

It is believed that the input and/or output signals may be represented by other component systems than Cartesian components. For example polar components or non-rectangular components may possibly be used.

BRIEF DESCRIPTION OF THE DRAWINGS

Embodiments of the invention will now be described by reference to the following drawings, in which:

FIG. 2 is a block diagram of a demodulator embodying the invention, and

FIG. 3 is a diagram showing regions of stability for FIG. 1,

DETAILED DESCRIPTION OF PREFERRED EMBODIMENTS

Figure 1:
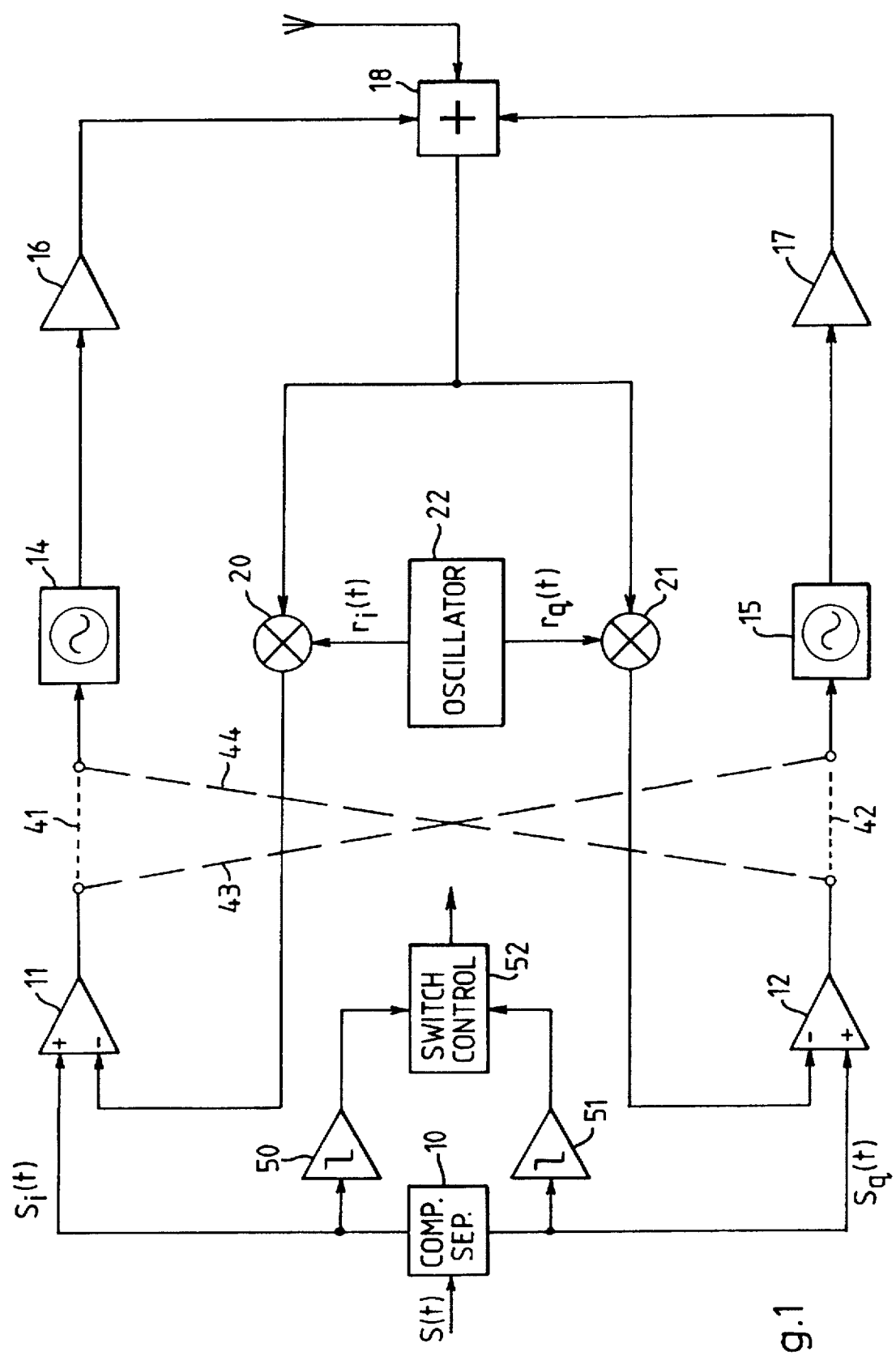
FIG. 1 is a block diagram of an amplifier/modulator embodying the invention.

In FIG. 1, an input signal s(t) having for example amplitude or phase variations, or both, is separated by a known component separator 10 into two component signals which vary in amplitude and phase but are in phase quadrature. These two components, $s_i(t)$ and $s_q(t)$ are the Cartesian components (I and Q) of the input signal and each component signal is passed to one of two feedback loops. As an alternative the input signal may be supplied in the form of separate I and Q signals. The first element in each loop is a comparator (11 and 12) and each component signal is passed to the non-inverting input of the comparator. The output signal of this comparator is passed, in this example, by way of connections 41 and 42 (which can be selected from connections 41 to 44 as is described below) to control the frequency of a voltage controlled oscillator (VCO) (14 and 15), and the resulting output signal is amplified by an a non-linear radio-frequency amplifier (16 and 17). The output signals from the amplifiers are combined, by a summing circuit 18 to produce, as is explained below, a frequency translated amplified version of the input signal s(t), at the frequency of the oscillator 22.

Feedback control is created for each loop by taking the output of the summing circuit 18, demodulating that signal with a signal $r_i(t)$ and $r_q(t)$) at a mixer (20 and 21) and passing the resulting feedback signal to the non-inverting input of the comparator of that loop. The signals $r_i(t)$ and $r_q(t)$ supplied to each mixer are the quadrature Cartesian components of a signal r(t) from an oscillator 22, and the frequency difference between the modulated signal at the output of the summing circuit 18 and the input to the component separator 10 equals the frequency of the oscillator 22.

In operation, the output of the mixer 20, for example, is compared by the comparator 11 with the signal $s_i(t)$ and any difference, assuming the direct connections 41 and 42 are made, controls the frequencies generated by the VCO 14 so that its output signal is such that when summed with the output of the VCO 15 and demodulated by the mixer 20, it forms a replica of $s_i(t)$. In a similar way the output signal of the VCO 15 when summed with the output of the VCO 14 and demodulated by the mixer 21 is a replica of $s_q(t)$. Thus when the output signals of the VCOs 14 and 15 are combined by the summing circuit 18 they provide a signal at the reference frequency which is a frequency translated amplified version of s(t), assuming that the demodulation processes are exact (perfect gain and phase matching) and that the loop gain infinite giving feedback control loops with error signals of zero.

Since the amplitudes of the outputs of the VCOs are inherently constant the amplifiers 16 and 17 can be non-linear, for example Class C, so that high efficency amplification and modulation can be achieved. By providing feedback control the frequency and phase of each signal from the VCOs 14 and 15 is controlled to ensure that gain and amplitude matching is as required in combining these signals as components of the required output signal from the summing circuit 18. Deviations in gain as well as phase are corrected by phase variations in the signals combined caused by the action of feedback.

Where only modulation is required the amplifiers 16 and 17 can be omitted or of unity gain. Where only amplification is required, without frequency translation, then the frequency of the oscillator 22 is set to zero. For example the oscillator 22 and the mixers 20 and 21 may be omitted when the signals from the summing circuit 18 to the comparators 11 and 12 are arranged to be in phase quadrature, with the comparator 12 receiving a signal with a 90° phase shift, as described below in relation to FIG. 6.

The modulator of FIG. 1 can be viewed as a combination of two analogue phase locked loops and a basic understanding of the factors affecting system performance can be drawn from conventional phase locked loop theory. Loop gain will in practice be limited by stability of the feedback process, and loop capture range will dictate the ultimate modulation bandwidth.

FIG. 3 is a diagram in which a vector 45 represents the sine signal $r_q(t)$ from the oscillator 22 and a vector 46 represents the cosine signal $r_i(t)$. It can be shown mathematically that, if the connections 41 and 42 are as shown in FIG. 1 without any signal inversion, the stable region of lock for the combined loop system covers the semi-circle 49. This in effect limits the application of the modulator to formats such as full carrier amplitude modulation and amplitude shift keying.

A limited performance in one quadrant does not provide a universal modulator and stable operation in all four quadrants can be achieved if the sign of the feedback components is controlled as a function of the sign of the signals $s_i(t)$ and $s_q(t)$.

In order to determine the sign of $s_i(t)$ and $s_q(t)$, the two outputs of the component separator 10 are coupled to comparators 50 and 51, respectively, with each comparator providing a logic 1 for a positive input and a logic 0 for a negative input. These logic signals are applied to a switch control circuit 52 which controls the connections 41 to 43 and whether inversion is to occur within these connections. Such connections may be provided by known circuits. A number of connection schemes are suitable for four-quadrant stable operation and one is given in the following table, by way of example, where a primed connection designation, for example 41', indicates signal inversion and designations without primes indicate no inversion.

| $s_i(t)$ | $s_q(t)$ | To VCO 14 | To VCO 15 |
| --- | --- | --- | --- |
| 1 | 1 | 44 | 43' |
| 1 | 0 | 41 | 42 |
| 0 | 1 | 41' | 42' |
| 0 | 0 | 44' | 43 |

It may be shown, mathematically, that the stable region of lock for the combined loop system covers more than quadrant 48 and extends further to include the area up to line 48a.

FIG. 2 shows a demodulator according to the invention, in which an input signal to be demodulated is received by a summing circuit 25 from a source in this example illustrated by an antenna 26 but which could be any modulated signal source. When VCOs 27 and 28 are operating at exactly the frequencies and phases of components of the input signal, the input signal is cancelled in the summing circuit 25. At other times a small error signal reaches demodulators 32 and 33 where Cartesian components of the error signal are generated using quadrature reference signals $r_i(t)$ and $r_q(t)$ from an oscillator 34 at the frequency which carries the modulation to be detected (that is the carrier frequency). These Cartesian components, which should be zero when perfect cancellation occurs in the summing circuit 25, are compared with a zero magnitude signal in comparators 35 and 36 obtained by grounding the non-inverting inputs of these comparators, and the outputs obtained control the frequencies of the VCOs 27 and 28. As a result the output frequencies of these VCOs are replicas of the components of the input signal to the demodulator and are down converted by demodulators 37 and 38 using the respective quadrature outputs of the oscillator 34 to provide demodulated components of the modulation of the carrier signal. These components can be combined in a known way to provide a frequency translated replica of a radio-frequency input signal at the antenna 26.

Problems of stability also arise with the demodulation circuit and can be overcome by the use of the same switched connections as those of FIG. 1 controlled by the signs of the outputs of the demodulators 32 and 33.

Amplifiers 29 and 30 are shown in FIG. 2 at the outputs of the VCOs 27 and 28 and are useful in correcting levels. To this end the gain of these amplifiers may be greater or less than unity, and in some circumstances they may not be required.

Figure 4:
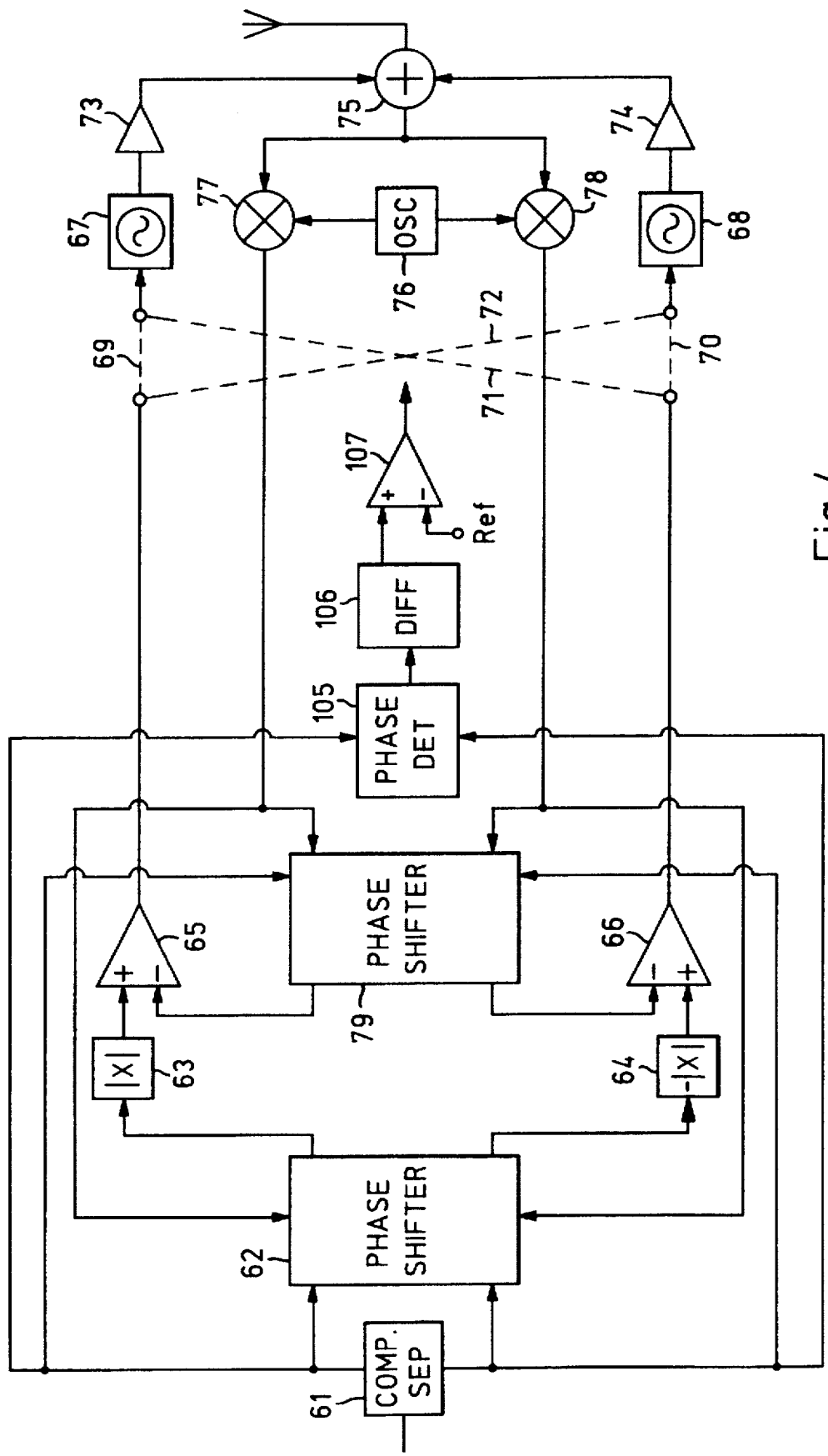
FIG. 4 is a block diagram of another amplifier/modulator embodying the invention.
Figure 5:
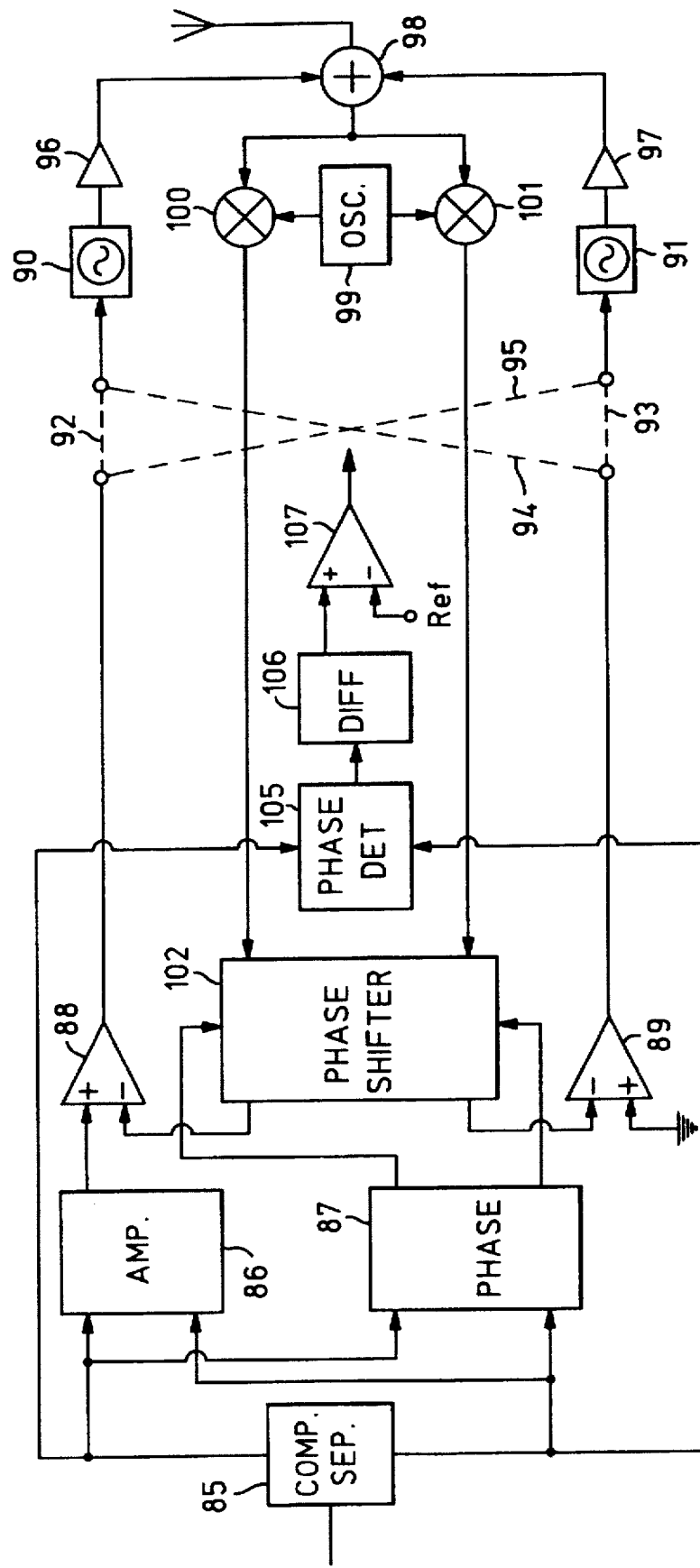
FIG. 5 is a block diagram of a third amplifier/modulator embodying the invention.

FIGS. 4 and 5 show embodiments of the invention which maintain stability in all four quadrants. The input signal is confined to the quadrant where the amplifier/modulator is stable and the necessary phase shift is added back to the output signal.

In FIG. 4 an input signal $Ae^{j\alpha}$, having for example amplitude or phase variations, or both, is separated by a known component separator 61 in a manner as described in relation to FIG. 1. Alternatively the input signal may be supplied as separate I and Q signals, $\cos\alpha$ and $\sin\alpha$. Each component signal is passed to a phase shifter 62 which shifts the phase of each signal by a factor $\beta$, which is the difference in phase between the input and the output signals. The absolute value of each phase shifted input component signal is taken by the 'rectifier' circuits 63 and 64, leaving a signal containing mainly amplitude information. This ensures that each component signal is kept in a region for which the combined system is stable, as illustrated by quadrant 48 of FIG. 3 and described above. The output signals of the rectifiers are passed to the non-inverting inputs of the comparators 65, 66 in the latter after inversion. The output signal of the comparator controls the frequency of a VCO 67, 68 via switchable connections 69, 70, 71 and 72. The resulting output signal may be amplified by a non-linear RF amplifier 73, 74. As before these amplifiers may be omitted or of unity gain where only modulation is required. The outputs of the two amplifiers are combined by summing circuit 75 to produce a frequency translated amplified version of the input signal.

Feedback control is provided for each loop in a similar manner to that used in the embodiment Illustrated by FIG. 1, by demodulating the output of the summing circuit 75, $Be^{j(\beta+\omega t)}$ with quadrature signals $\cos(\omega t)$, $\sin(\omega t)$ produced by the oscillator 76 at the mixers 77, 78. The phase of each input component is added back into the feedback loop by shifting the demodulated component of the output signal with the phase of the component of the input signal at a phase shifter 79; thus the signal from the mixer 77, 78 are shifted in phase by a factor $\beta-\alpha$. The feedback loop is completed by passing the resulting signal to the inverting input of the comparator. The frequency difference between the output signal and the input signal is that of the frequency of the oscillator 76.

FIG. 5 is a simplified version of the amplifier/modulator shown in FIG. 4. An input signal $Ae^{j\alpha}$, of the type described in relation to FIG. 4 is separated by a known component separator 85 in a manner as described in relation to FIG. 1. The absolute value of the input signal, i.e. the amplitude information, is selected by a circuit 86 and this value is passed into the non-inverting input of a comparator 88. The phase component of each signal is selected by circuit 87 which limits each component signal to unity, with phase information. The non-inverting input of a comparator 89 is grounded and thus the output of the comparator mirrors the input of the non-inverting input. The output signal of the comparator 88, 89 controls the frequency of a VCO 90. 91 via switchable connections 92, 93, 94 and 95. The resulting output signal may be amplified by a non-linear RF amplifier 96, 97. As before these amplifiers may be omitted or of unit gain where only modulation is required. The outputs of the two amplifiers are combined by summing circuit 98 to produce a frequency translated amplified version of the input signal at the frequency of the oscillator 99.

Feedback control is provided for each loop in a similar manner to that used in the embodiment illustrated by FIG. 4, by demodulating the output of the summing circuit 98, $Be^{j(\beta+\omega t)}$ with quadrature signals cos ($\omega t$), sin($\omega t$) produced by the oscillator 99 at mixers 100, 101. The phase of each input component is added back into each feedback loop by shifting the demodulated component of the output signal with the phase of each component of the input signal at a phase shifter 102. The feedback loop is completed by passing the resulting signal to the inverting input of the comparator. The frequency difference between the output signal and the input signal is that of the frequency of the oscillator 99.

Although the input to the loops is constrained to be within the stable region of the system, VCO switching may be required to reduce impulse noise generated by the VCO. When the envelope of the input signal crosses zero (hereafter 'zero crossing') the phase of the input signal changes by 180° and this can be illustrated by plotting a vector of the input signal onto FIG. 3. When the envelope crosses zero the vector will cross from one quadrant to the diagonally opposite quadrant and will pass through the origin. The outputs of the VCOs, when summed at the summing junction, produces a similar signal to that of the input and thus when the input phase changes by 180° the output will also change by 180°. Since the output is created by summing the outputs of the two VCOs, it can be shown that the output of each VCO needs to change by 180° as well. The VOCs introduce a finite delay into the system and also generate an impulse noise. FIGS. 4 and 5 include a phase detector 105 and a differentiator 106 which in combination produce a signal when the phase changes by 180°. The output of the differentiator is coupled to the non-inverting input of a comparator 107, the inverting input of which is coupled to a reference signal. When the output of the differentiator crosses a threshold, which is that of the reference signal, the inputs to the VCOs are switched by the switching connections, (69, 70, 71 and 72 in FIG. 4 and 92, 93, 94 and 95 in FIG. 5).

The embodiment illustrated in FIG. 1 will also generate impulse noise when zero crossing occurs. For clarity the phase detector, differentiator, comparator and further switchable connections have been omitted. Alternatively the switch controls may take into account zero crossing and switch accordingly.

Figure 6:
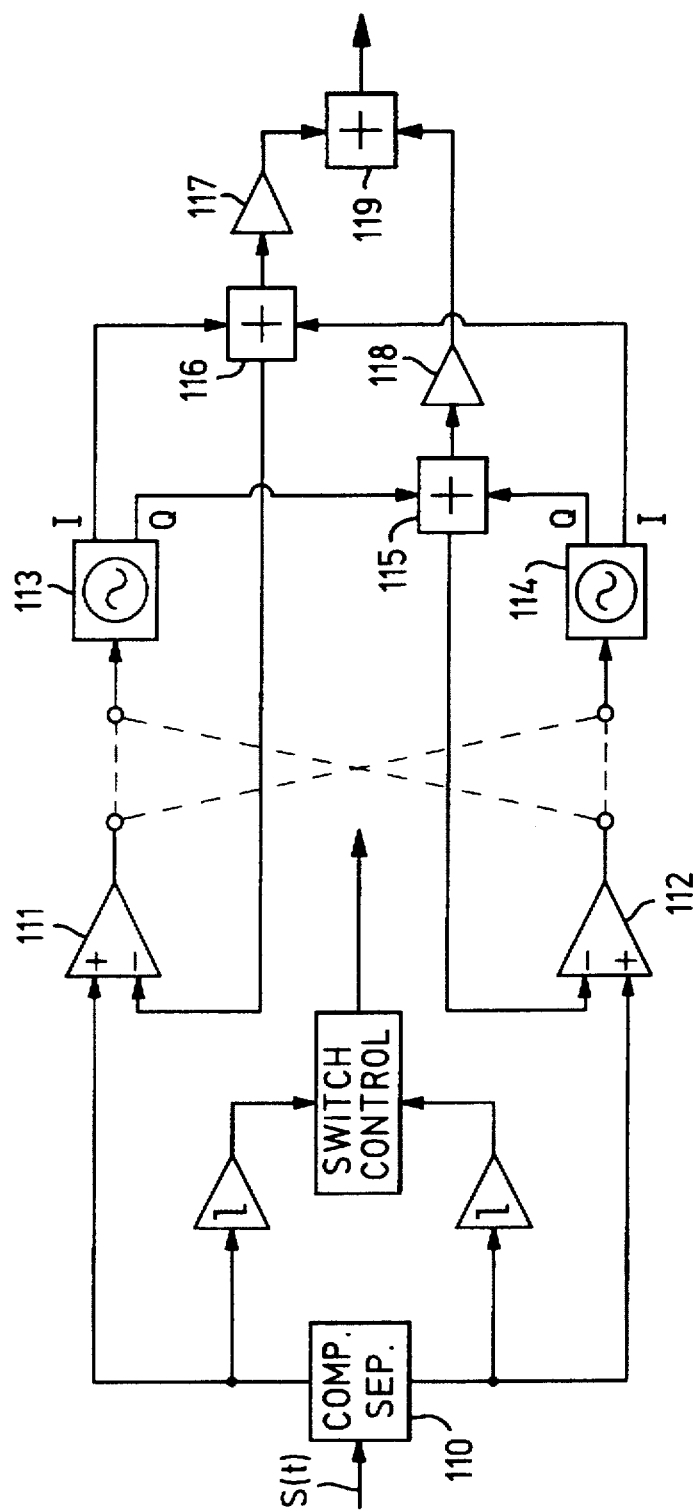
FIG. 6 is a block diagram of an amplifier embodying the invention

If the system is to amplify without modulation (if the oscillator is set near to or at zero) an alternative arrangement is needed to create suitable phase quadrature feedback signals. FIG. 6 is an illustration of a modified version of the embodiment of the circuit shown in FIG. 1, which works substantially as described above. Similar arrangements may be applied to the embodiments illustrated in FIGS. 4 and 5. An input signal of the type described in relation to FIG. 1 is separated by a component separator, as described above. The component signals are passed to the non-inverting input of the comparator 111, 112, the output of which is connected via switchable connections (as described in relation to FIG. 1) to a VCO 113, 114. The VCO generates at its output two signals I and Q, which are in phase quadrature with each other. The Q signal of each VCO (113, 114) is summed by summing circuit 115. One output of the summing junction forms the feedback loop and is passed to the inverting input of the comparator 112. The I signal of each VCO (113, 114) is summed by summing circuit 116. One output of the summing junction forms the feedback loop and is passed to the inverting input of the comparator 111. The other outputs of the summing junctions 115, 116 are passed to amplifiers 117 and 118 and the amplified signals are summed by summing junction 119. Switch control for the VCOs may be provided in the same manner as described in relation to FIG. 1 and zero crossing switching may also be applied if desired.

Some alternative arrangements relating to FIG. 6 will now be mentioned. In the first, the amplifiers 117 and 118, and the summing junction 119 are omitted, respective substitute amplifiers are connected in the I signal paths between the VCOs 113 and 114, and the summing junction 116, and the output signal is taken from the summing junction 116. The substitute amplifiers may instead be in corresponding positions in the Q signal paths. In both cases an attenuator or a further amplifier is required to ensure that the two feedback signals are at corresponding levels at the comparators 111 and 112. Substitute amplifiers may be used in both I and Q paths at the VCO outputs. Such arrangements have the advantage that the substitute amplifiers are included in the feedback loop before summation to provide the output signal. The amplifiers 117 and 118 and/or the summing junction 119 may be used in addition to the substitute amplifiers in any of the substitute amplifier arrangements.

It will be realised that the invention can be put into operation in many other ways than those specifically described. For example the VCOs may be any form of frequency generator having an output signal which can be controlled using a control signal, for example some forms of unstable amplifier or direct digital synthesizers.

The switching matrices of FIGS. 1, 4, 5 and 6 may in some situations be replaced by permanent connections which give a stable arrangement and prevent impulse noise on zero crossing.

Since Cartesian components of an input signal, and some alternative kinds of components, are phase modulated, the invention can handle any other types of modulation in addition to those mentioned.

We claim:

1. Apparatus for processing a first signal to generate a second signal, the processing arrangement comprising:

input means for receiving said first signal and generating first and second process reference signals of said first signal;

first and second feedback loops, each loop comprising a voltage controlled oscillator responsive to a control signal for generating a loop output signal and a comparator for generating the control signal;

combining means for combining the loop output signals from each loop for deriving the second signal;

means for providing first and second feedback loop operating signals, dependent on the combined loop output signals from the combining means and in phase quadrature with one another;

the feedback loop operating signals being applied to corresponding inputs of the comparators of the first and second loops, respectively, and another input of each comparator being coupled to receive a respective one of said first and second process reference signals.

2. Apparatus according to claim 1, wherein the means for providing the feedback loop operating signals includes a quadrature oscillator having quadrature output signals; and first and second mixers, one for each loop, for generating the first and second feedback loop operating signals, each of the mixers being coupled to receive the second signal as one input and a respective one of the quadrature output signals from the oscillator as another input.

3. Apparatus according to claim 2, wherein the first signal is an input signal for amplification or modulation and the second signal is an output signal.

4. Apparatus according to claim 3, including an amplifier for each loop connected between the voltage controlled oscillator for that loop and a respective input of the combining means.

5. Apparatus according to claim 3, arranged as a modulator including first and second input terminals for the application of first and second Cartesian components of said first signal connected as the process reference signals for the comparators of the first and second loops, respectively; and
an output terminal of the combining means;
whereby a modulated signal appears at said output terminal which is the input signal frequency translated by the frequency of the quadrature oscillator.

6. Apparatus according to claim 5, including a component separator for receiving a modulating input signal and deriving Cartesian components thereof for application to the said first and second input terminals.

7. Apparatus according to claim 1, arranged with amplification of the second signal wherein the means for providing the feedback loop operating signals comprises means for deriving quadrature-phase signals from the second signal as the first and second feedback loop operating signals.

8. Apparatus according to claim 1, including control means for controlling respective connections within or between components for the two feedback loops both in respect of determining the said connections and also whether the said connections include signal inversion, the control means operating in accordance with signal characteristics to ensure that stable operation occurs.

9. Apparatus according to claim 8, wherein the signal characteristics are the signs of one input signal for each comparator, and the respective connections are connections between the comparators and the voltage controlled oscillators.

10. Apparatus according to claim 1, wherein the process reference signals are Cartesian components of the first signal, including phase control means for controlling the phases of the process reference signals to ensure stable operation of the apparatus.

11. Apparatus according to claim 10, wherein the phase control means comprises a first phase shifter for subtracting the phase of the feedback loop out signals from that of both the process reference signals before application to the comparators, and
a second phase shifter for subtracting the phase of the first signal from that of both the first and second feedback loop operating signals before application to the comparators.

12. Apparatus according to claim 11 including rectifying means for taking the modulus for each output of the first phase shifter before application to the comparators.

13. Apparatus according to claim 10, wherein the phase control means comprises
means for providing a signal representative of the amplitude of the first signal as one process reference signal and means for providing a constant signal as the other process reference signal;
a phase shifter controlled by first and second phase control signals for shifting the phases of the first and second feedback loop operating signals before application to the comparators; and
means for providing signals representative of the phases of the Cartesian components as the first and second phase control signals.

14. Apparatus for processing a first signal to generate a second signal, the processing arrangement comprising:
input means for receiving said first signal and generating first and second process reference signals of said first signal;
first and second feedback loops, each loop comprising a voltage controlled oscillator responsive to a control signal for generating a loop output signal and a comparator for generating the control signal;
combining means for combining the loop output signals from each loop for deriving the second signal;
means for providing first and second feedback loop operating signals, dependent on the combined loop output signals from the combining means and in phase quadrature with one another;
the feedback loop operating signals being applied to corresponding inputs of the comparators of the first and second loops, respectively, and
another input of each comparator being coupled to receive a respective one of said first and second process reference signals;
detection means for detecting zero crossings in one of the first signal or the envelope thereof; and
noise-reduction switching means for changing over the voltage controlled oscillator between loops when a zero crossing is detected by the detection means.

15. Apparatus according to claim 1, including
detection means for detecting zero crossings in an envelope of the first signal; and
noise reduction switching means for changing over the voltage controlled oscillator between loops when a zero crossing is detected by the detection means.

16. Apparatus according to claim 1, wherein the process reference signals are Cartesian components of the first signal wherein each voltage controlled oscillator generates Cartesian components of the loop output signal, and the apparatus includes:
first and second means for combining corresponding Cartesian loop output signals to provide the first and second feedback loop operating signals, and third combining means for combining the output of the first and second combining means to provide the second signal.

17. Apparatus according to claim 16, including first and second amplifiers connected between the first combining means and the third combining means, and the second combining means and the third combining means, respectively.

18. A method of processing a first signal to generate from said first signal a second signal comprising the steps of:
providing said first signal and generating first and second process reference signals of said first signal;
using first and second feedback loops, to generate a loop output signal for each loop having a frequency which is variable in response to a control signal;
combining the loop output signals from each loop for deriving the second signal;
generating feedback loop operating signals, in phase quadrature with one another, from the, combined loop output signals; and
comparing each feedback loop operating signal with a respective one of said first and second process reference signals to provide the respective control signals.

19. A method according to claim 18 comprising the steps of:
   generating respective quadrature signals, and
   generating the feedback loop operating signals includes mixing the second signal with the respective quadrature signal to provide the feedback loop operating signal.

20. A method according to claim 18, wherein the first signal is an input signal for modulation or amplification and the second signal is an output signal.

21. A method according to claim 20 including amplifying the loop output signals before combining them.

22. A method of modulation according to claim 20, wherein Cartesian components of the input signal are used as the respective process reference signals, and the second signal forms the output signal.

23. An amplifying method according to claim 18, wherein quadrature phase versions of said second signal form the feedback loop operating signals.

24. A method according to claim 18, including controlling connections between the two feedback loops, determining whether said connections include signal inversions, and altering the said connections to ensure stable operation occurs.

25. A method according to claim 18 including
   providing Cartesian components of the first signal as the respective process reference signals, and
   controlling the phases of the respective process reference signals to ensure stable operation.

26. A method according to claim 18 including
   detecting zero crossings of the first signal or envelope thereof, and
   changing connections between the two feedback loops when said zero crossings occur.

27. Apparatus for demodulating an input signal having an associated carrier frequency, comprising:
   a summing circuit for combining the input signal to be demodulated with first and second feedback signals to output an error signal;
   first and second feedback loops each receiving the error signal from the summing circuit and providing to the summing circuit said first and second feedback signals replicating Cartesian components of the input signal;
   an oscillator for providing to said first and second feedback loops corresponding first and second operating signals at the carrier frequency but in phase quadrature with one another; and
   each loop comprising:
      a comparator for generating a control signal derived at least in part from the error signal, and
      a voltage controlled oscillator having at least one of a frequency or phase characteristic which varies in response to the control signal, the oscillator generating in response to the control signal one of the first and second feedback signals; and
   first and second out-of-loop mixers, one associated with each of said first and second feedback loops, for receiving corresponding ones of the first and second operating signals and first and second feedback signals for outputting therefrom respective output signals.

28. An apparatus according to claim 27, wherein each loop further comprises:
   an amplifier connected between the voltage controlled oscillator for that loop and the summing circuit to receive and amplify the corresponding first and second feedback signals.

29. An apparatus according to claim 28 wherein:
   the summing circuit comprises:
      first, second and third input terminals, and an output terminal,
      the first input terminal receiving the first feedback signal,
      the second input terminal receiving the second feedback signal,
      the third input terminal receiving the input signal, and
      the error signal appearing at the output terminal, the error signal representing deviations in phase or frequency between the first and second feedback signals and the input signal;
   each loop further comprising:
      an in-loop mixer to receive the error signal from the summing circuit and a corresponding one of the first and second operating signals from the oscillator and to combine them into a in-loop mixer output provided to the comparator, and
   wherein the comparator for each loop generates the control signal by comparing the in-loop mixer output for that loop with a zero magnitude signal.

30. An apparatus according to claim 29, further including means for combining the respective output signals from the first and second out-of-loop mixers to derive a signal representative of modulation carried by the input signal.

31. A method of demodulating an input signal having an associated carrier frequency, comprising the steps of:
   combining the input signal to be demodulated at a summing circuit with first and second feedback signals for producing an error signal therefrom;
   receiving the error signal from the summing circuit at first and second feedback loops and providing to the summing circuit from the loops said first and second feedback signals replicating Cartesian components of the input signal;
   providing to said first and second feedback loops corresponding first and second operating signals at the carrier frequency but in phase quadrature with one another; and
   within each loop:
      mixing, within the loop, a corresponding first and second operating signal with the error signal to output an in-loop mixed signal,
      comparing the in-loop mixed signal to a reference signal to generate a control signal, and
      generating a voltage controlled oscillation signal having at least one of a frequency or phase characteristic which varies in response to the control signal to thereby generate in response to the control signal one of the first and second feedback signals;
   receiving, at mixers outside of the loops, corresponding ones of the first and second operating signals and corresponding ones of the first and second feedback signals to provide respective output signals associated with each of said loops.

32. A method according to claim 31, further comprising:
   combining in the summing circuit the first and second feedback signals and the input signal in such a way that the error signal deprived therefrom represents deviations in phase or frequency between the first and second feedback signals and the input signal; and
   in each loop, comparing the in-loop mixed signal to a zero magnitude reference signal.

* * * * *